US010571810B2

(12) United States Patent
Van Sommeren et al.

(10) Patent No.: US 10,571,810 B2
(45) Date of Patent: *Feb. 25, 2020

(54) SUBSTRATE TABLE, A LITHOGRAPHIC APPARATUS AND A METHOD OF OPERATING A LITHOGRAPHIC APPARATUS

(71) Applicant: ASML NETHERLANDS B.V., Veldhoven (NL)

(72) Inventors: Daan Daniel Johannes Antonius Van Sommeren, Beuningen (NL); Coen Hubertus Matheus Baltis, Eindhoven (NL); Harold Sebastiaan Buddenberg, Sittard (NL); Giovanni Luca Gattobigio, Eindhoven (NL); Johannes Cornelius Paulus Melman, Oisterwijk (NL); Günes Nakiboglu, Eindhoven (NL); Theodorus Wilhelmus Polet, Geldrop (NL); Walter Theodorus Matheus Stals, Eindhoven (NL); Yuri Johannes Gabriël Van De Vijver, Best (NL); Josephus Peter Van Lieshout, Eindhoven (NL); Jorge Alberto Vieyra Salas, Eindhoven (NL); Aleksandar Nikolov Zdravkov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/407,878

(22) Filed: May 9, 2019

(65) Prior Publication Data

US 2019/0265597 A1    Aug. 29, 2019

Related U.S. Application Data

(63) Continuation of application No. 15/781,813, filed as application No. PCT/EP2016/076352 on Nov. 2, 2016, now Pat. No. 10,317,804.

(30) Foreign Application Priority Data

Dec. 8, 2015 (EP) .................................. 15198441.6

(51) Int. Cl.
*G03F 7/20* (2006.01)

(52) U.S. Cl.
CPC ...... *G03F 7/70341* (2013.01); *G03F 7/70716* (2013.01)

(58) Field of Classification Search
CPC .................................................. G03F 7/70341
See application file for complete search history.

(56) References Cited

U.S. PATENT DOCUMENTS 7,397,532 B2    7/2008  Novak
2004/0109981 A1  6/2004  Lawrence et al.
(Continued)

FOREIGN PATENT DOCUMENTS

CN    102193333 A    9/2011
EP     1420298 A2    5/2004
(Continued)

OTHER PUBLICATIONS

Japanese Office Action Issued in corresponding Japanese Patent Application No. 2018-517720, dated Jun. 6, 2019.
(Continued)

*Primary Examiner* — Michelle M Iacoletti
(74) *Attorney, Agent, or Firm* — Pillsbury Winthrop Shaw Pittman, LLP

(57) ABSTRACT

A substrate table configured to support a substrate for exposure in an immersion lithographic apparatus, the substrate table including: a support body having a support surface configured to support the substrate; and a cover ring fixed relative to the support body and configured to surround, in plan view, the substrate supported on the support surface, wherein the cover ring has an upper surface and at
(Continued)

least a portion of the upper surface is configured so as to alter the stability of a meniscus of immersion liquid when moving along the upper surface towards the substrate.

20 Claims, 14 Drawing Sheets

(56) References Cited

U.S. PATENT DOCUMENTS

| | | |
|---|---|---|
| 2004/0160582 A1 | 8/2004 | Lof et al. |
| 2004/0207824 A1 | 10/2004 | Lof et al. |
| 2005/0264778 A1 | 12/2005 | Lof et al. |
| 2007/0109521 A1 | 5/2007 | Nishii et al. |
| 2007/0146665 A1 | 6/2007 | Ottens et al. |
| 2007/0146666 A1 | 7/2007 | Antonius Leenders et al. |
| 2007/0229786 A1 | 10/2007 | Kemper et al. |
| 2008/0198346 A1 | 8/2008 | Iimura et al. |
| 2009/0059191 A1 | 3/2009 | Ogusu |
| 2009/0168042 A1 | 7/2009 | Kroonen et al. |
| 2009/0218743 A1 | 9/2009 | Fujiwara et al. |
| 2009/0279058 A1 | 11/2009 | Hasegawa |
| 2009/0296056 A1 | 12/2009 | Mondt et al. |
| 2010/0045949 A1 | 2/2010 | Nakano et al. |
| 2010/0118289 A1 | 5/2010 | Ogusu |
| 2011/0228238 A1 | 9/2011 | Roset et al. |
| 2013/0033692 A1 | 2/2013 | Bessems et al. |
| 2013/0057838 A1 | 3/2013 | Sato |
| 2015/0131064 A1 | 5/2015 | Laurent et al. |

FOREIGN PATENT DOCUMENTS

| | | |
|---|---|---|
| EP | 2738792 A2 | 6/2014 |
| JP | 2004289127 | 10/2004 |
| JP | 2005-303167 A | 10/2005 |
| JP | 2006054427 | 2/2006 |
| JP | 2007180555 | 7/2007 |
| JP | 2007194613 | 8/2007 |
| JP | 2010-206113 A | 9/2010 |
| JP | 2014-060217 A | 4/2014 |
| WO | 2004112108 | 12/2004 |
| WO | 2013/178484 A1 | 12/2013 |

OTHER PUBLICATIONS

International Search Report issued in corresponding International Patent Application No. PCT/EP2015/076352 dated Feb. 22, 2017.
Written Opinion of the International Searching Authority issued in corresponding International Patent Application No. PCT/EP2016/076352 dated Feb. 22, 2017.
Jiansheng Feng et al., "One-way wicking in open micro-channels controlled by channel topography", Journal of Colloid and Interface Science, vol. 404 (2013) pp. 169-178.
Communication pursuant to Article 94(3) EPC dated Mar. 26, 2019 issued in corresponding EP Application No. 16790343.4.
Office Action dated Nov. 14, 2019 issued in corresponding Chinese Patent Application No. 201680081344.7.

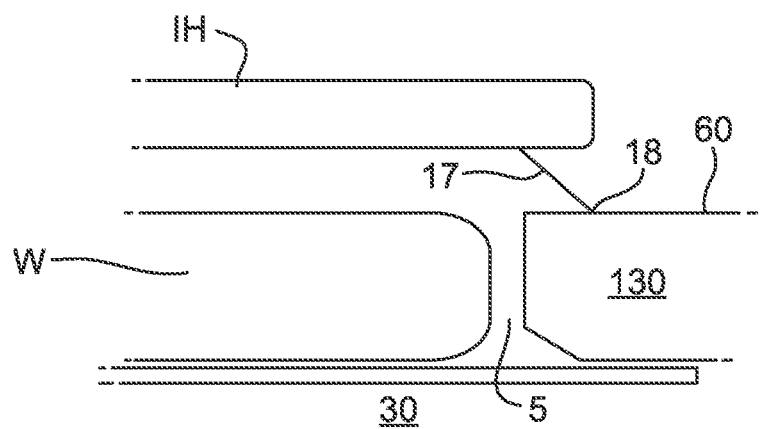
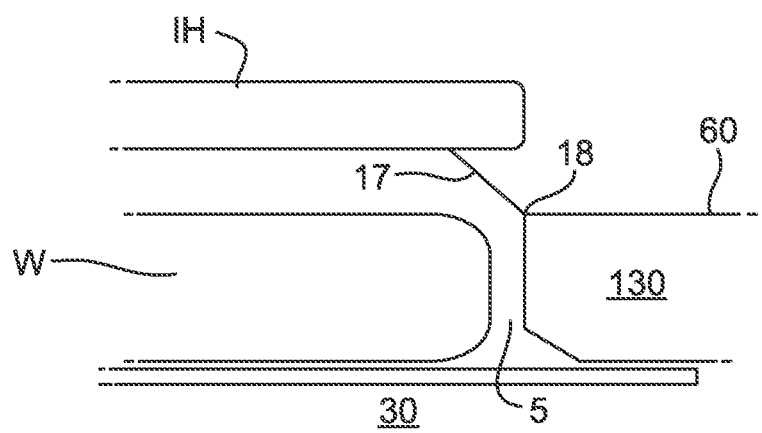
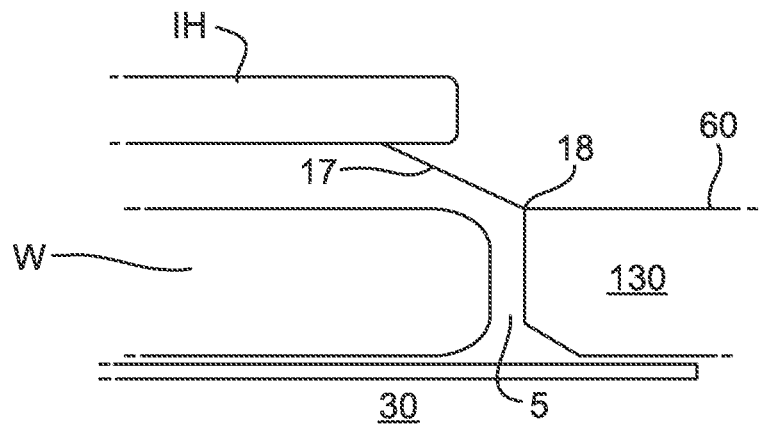

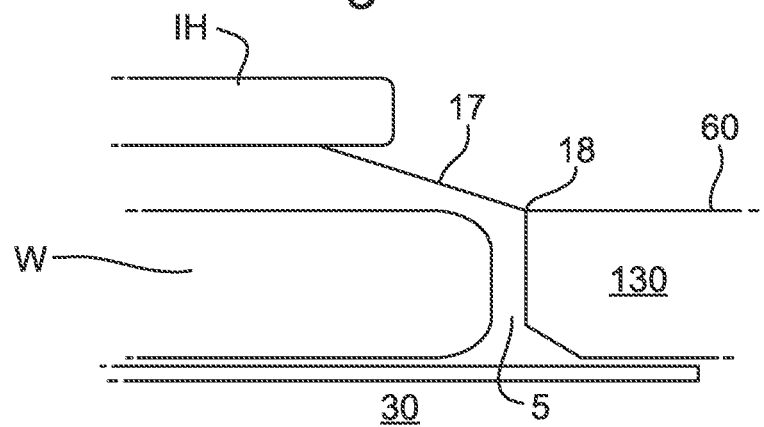
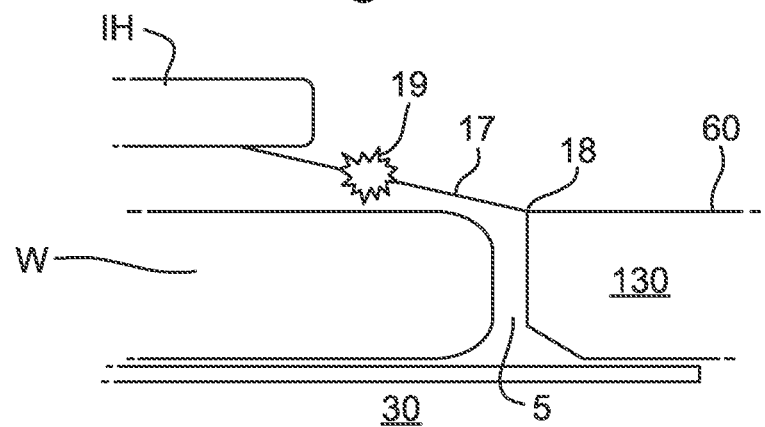
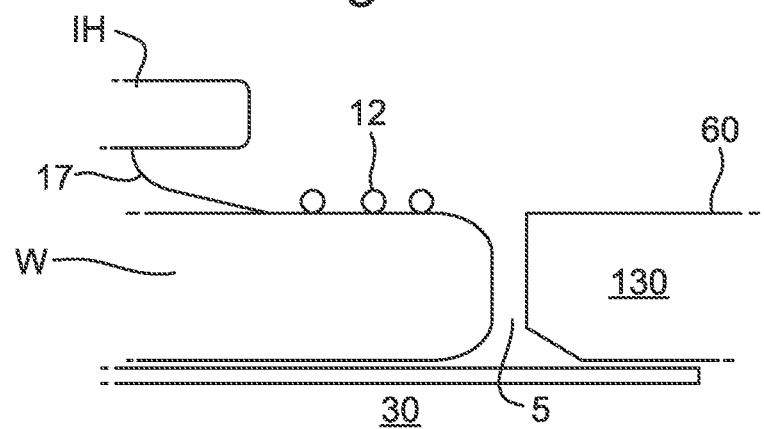

SUBSTRATE TABLE, A LITHOGRAPHIC APPARATUS AND A METHOD OF OPERATING A LITHOGRAPHIC APPARATUS

This application is a continuation of pending U.S. patent application Ser. No. 15/781,813, filed Jun. 6, 2018, which is the U.S. national phase entry of PCT patent application no. PCT/EP2016/076352, filed on Nov. 2, 2016, which claims the benefit of priority of European patent application no. 15198441.6, filed on Dec. 8, 2015, each of the foregoing applications is incorporated herein in its entirety by reference.

FIELD

The present description relates to a substrate table, a lithographic apparatus and a method of operating a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Handling immersion liquid in a lithographic apparatus brings with it one or more problems of liquid handling. A gap normally exists between an object, such as a substrate and/or a sensor, and a table (e.g. a substrate table or a measurement table) around the edge of the object (e.g., substrate and/or sensor). U.S. patent application publication no. US 2005-0264778, discloses filling that gap with material or providing a liquid source or low pressure source to deliberately fill the gap with liquid in order to avoid bubble inclusion as the gap passes under the liquid supply system and/or to remove any liquid which does enter the gap.

The liquid confinement structure that confines the immersion liquid moves relative to the table such that the liquid confinement structure moves across the gap between the object (e.g. the substrate) and the table. When the liquid confinement structure crosses the gap in the direction of the object, and then continues to move across the object, droplets of immersion liquid can be left on the surface of the object. These droplets cause various problems, for example temperature changes that can deform the surface of the object as the droplet evaporates, and imaging defects due to the effect of the droplets on the radiation beam that forms the images.

SUMMARY

It is desirable, for example, to provide for a reduction in the possibility of droplets of immersion liquid being deposited on the surface of an object when the liquid confinement structure moves across the surface of the object.

According to an aspect, there is provided a substrate table configured to support a substrate for exposure in an immersion lithographic apparatus, the substrate table comprising: a support body having a support surface configured to support the substrate; and a cover ring fixed relative to the support body and configured to surround, in plan view, the substrate supported on the support surface, wherein the cover ring has an upper surface; wherein at least a portion of the upper surface is configured so as to alter the stability of a meniscus of immersion liquid when moving along the upper surface towards the substrate.

According to an aspect, there is provided a substrate table configured to support a substrate for exposure in an immersion lithographic apparatus, the substrate table comprising: a support body having a support surface configured to support the substrate; and a cover ring configured to surround, in plan view, the substrate supported on the support surface, wherein the cover ring has an upper surface; wherein at least a portion of the upper surface is configured so as to facilitate pinning of a contact line between a meniscus of immersion liquid and the upper surface when moving along the upper surface towards the substrate.

According to an aspect, there is provided a method of operating an immersion lithographic apparatus, comprising: providing immersion liquid on an upper surface of a cover ring fixed relative to a support body of a substrate table; and controlling the immersion liquid to move from the upper surface onto a substrate supported by a support surface of the support body; wherein at least a portion of the upper surface is configured so as to alter the stability of a meniscus of the immersion liquid when moving along the upper surface towards the substrate.

According to an aspect, there is provided a method of operating an immersion lithographic apparatus, comprising: providing immersion liquid on an upper surface of a cover ring fixed relative to a support body of a substrate table; and controlling the immersion liquid to move from the upper surface onto a substrate supported by a support surface of the support body; wherein at least a portion of the upper surface is configured so as to facilitate pinning of a contact line between a meniscus of the immersion liquid and the upper surface when moving along the upper surface towards the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7 to 12 depict, in cross-section, droplets being deposited on a substrate;

DETAILED DESCRIPTION

Figure 1:
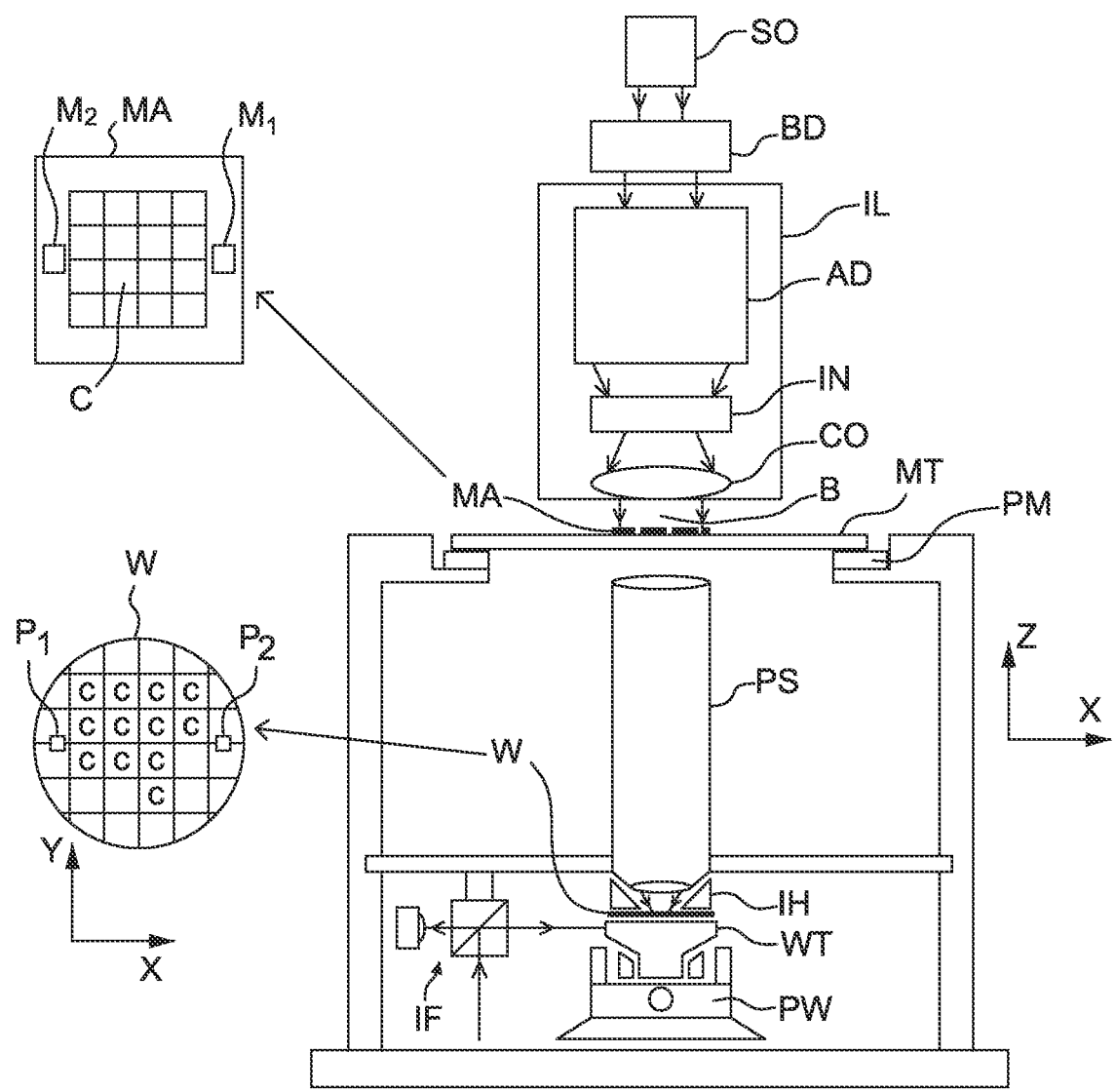
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus, and other conditions, such as for example whether or not the patterning device MA is held in a vacuum environment. The mask support structure MT can use mechanical, vacuum, electrostatic or other clamping techniques to hold the patterning device MA. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device".

The term "patterning device" used herein should be broadly interpreted as referring to any device that can be used to impart a radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the lithographic apparatus is of a transmissive type (e.g. employing a transmissive mask). Alternatively, the lithographic apparatus may be of a reflective type (e.g. employing a programmable mirror array of a type as referred to above, or employing a reflective mask).

The lithographic apparatus may comprise a measurement table (not depicted in FIG. 1) that is arranged to hold measurement equipment, such as sensors to measure properties of the projection system PS. In an embodiment, the measurement table is not configured to hold a substrate W.

The lithographic apparatus may be of a type having two (dual stage) or more substrate tables WT or "substrate supports" (and/or two or more mask support structures MT or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate W may be covered by a liquid having a relatively high refractive index, e.g. water, so as to fill an immersion space 11 between the projection system PS and the substrate W. An immersion liquid may also be applied to other spaces in the lithographic apparatus, for example, between the patterning device MA and the projection system PS. Immersion techniques can be used to increase the numerical aperture of projection systems. The term "immersion" as used herein does not mean that a structure, such as a substrate W, must be submerged in liquid, but rather only means that a liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD including, for example, suitable directing mirrors and/or a beam expander. In other cases the radiation source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may include an adjuster AD configured to adjust the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CO. The illumination system IL may be used to condition the radiation beam B, to have a desired uniformity and intensity distribution in its cross-section. Similar to the radiation source SO, the illumination system IL may or may not be considered to form part of the lithographic apparatus. For example, the illumination system IL may be an integral part of the lithographic apparatus or may be a separate entity from the lithographic apparatus. In the latter case, the lithographic apparatus may be configured to allow the illumination system IL to be mounted thereon. Optionally, the illumination system IL is detachable and may be separately provided (for example, by the lithographic apparatus manufacturer or another supplier).

The radiation beam B is incident on the patterning device MA, which is held on the mask support structure MT, and is patterned by the patterning device MA. Having traversed the patterning device MA, the radiation beam B passes through the projection system PS, which focuses the radiation beam B onto a target portion C of the substrate W. With the aid of the second positioning device PW and a position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA and the substrate W may be aligned using mask alignment marks M1, M2 and substrate alignment marks P1, P2. Although the substrate alignment marks P1, P2 as illustrated occupy dedicated target portions C, they may be located in spaces between target portions C (these are known as scribe-lane alignment marks). Similarly, in situations in which more than one die is provided on the patterning device MA, the mask alignment marks M1, M2 may be located between the dies.

Arrangements for providing liquid between a final element of the projection system PS and the substrate W can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
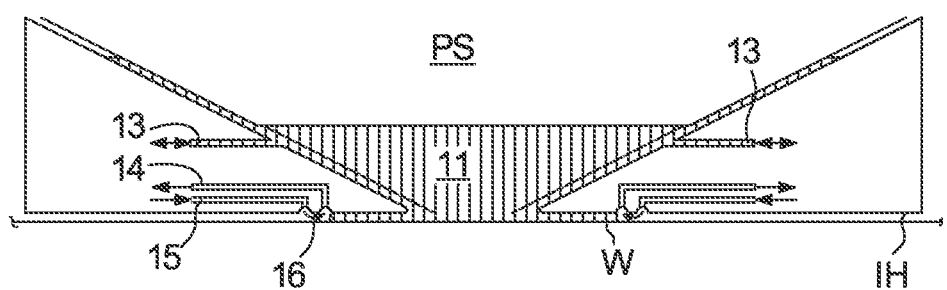
FIG. 2 depicts a liquid supply system for use in a lithographic projection apparatus.

An arrangement which has been proposed is to provide a liquid confinement structure which extends along at least a part of a boundary of the space between the final element of the projection system and the substrate, substrate table or both. Such an arrangement is illustrated in FIG. 2. The arrangement illustrated in FIG. 2 and described below may be applied to the lithographic apparatus described above and illustrated in FIG. 1.

FIG. 2 schematically depicts a localized liquid supply system or fluid handling system with a liquid confinement structure IH, which extends along at least a part of a boundary of the immersion space 11 between the final element of the projection system PS and the substrate table WT or substrate W. (Please note that reference in the following text to surface of the substrate W also refers in addition or in the alternative to a surface of the substrate table WT, unless expressly stated otherwise.) In an embodiment, a seal is formed between the liquid confinement structure IH and the surface of the substrate W and which may be a contactless seal such as a gas seal (such a system with a gas seal is disclosed in European patent application publication no. EP-A-1,420,298) or a liquid seal.

The liquid confinement structure IH at least partly contains liquid in the immersion space 11 between a final element of the projection system PS and the substrate W. The immersion space 11 is at least partly formed by the liquid confinement structure IH positioned below and surrounding the final element of the projection system PS. Immersion liquid is brought into the immersion space 11 below the projection system PS and within the liquid confinement structure IH by liquid opening 13. The immersion liquid may be removed by liquid opening 13. Whether the immersion liquid is brought into the immersion space 11 or removed from the immersion space 11 by the liquid opening 13 may depend on the direction of movement of the substrate W and substrate table WT.

The immersion liquid may be contained in the immersion space 11 by a gas seal 16 which, during use, is formed between the bottom of the liquid confinement structure IH and the surface of the substrate W. The gas in the gas seal 16 is provided under pressure via a gas inlet 15 to the gap between the liquid confinement structure IH and the substrate W. The gas is extracted via a channel associated with an outlet 14. The overpressure on the gas inlet 15, vacuum level on the outlet 14 and geometry of the gap are arranged so that there is a high-velocity gas flow (forming the gas seal 16) inwardly that confines the immersion liquid. The force of the gas on the immersion liquid between the liquid confinement structure IH and the substrate W contains the immersion liquid in the immersion space 11. Such a system is disclosed in United States patent application publication no. US 2004-0207824, which is hereby incorporated by reference in its entirety. In an embodiment, the liquid confinement structure IH does not have a gas seal.

In a localized area liquid supply system, the substrate W is moved under the projection system PS and the liquid confinement structure IH. When, for example, an edge of the substrate W is to be imaged or when a sensor on the substrate table WT (or on the measurement table) is to be imaged or the substrate table WT is to be moved such that a dummy substrate or so-called closing plate can be positioned under the liquid confinement structure IH to enable, for example, substrate swap to take place, an edge of the substrate W (or other object) will pass under the immersion space 11. Immersion liquid may leak into the gap 5 between the substrate W and substrate table WT. This immersion liquid may be forced in under hydrostatic or hydrodynamic pressure or the force of a gas knife or other gas flow creating device.

Figure 3:
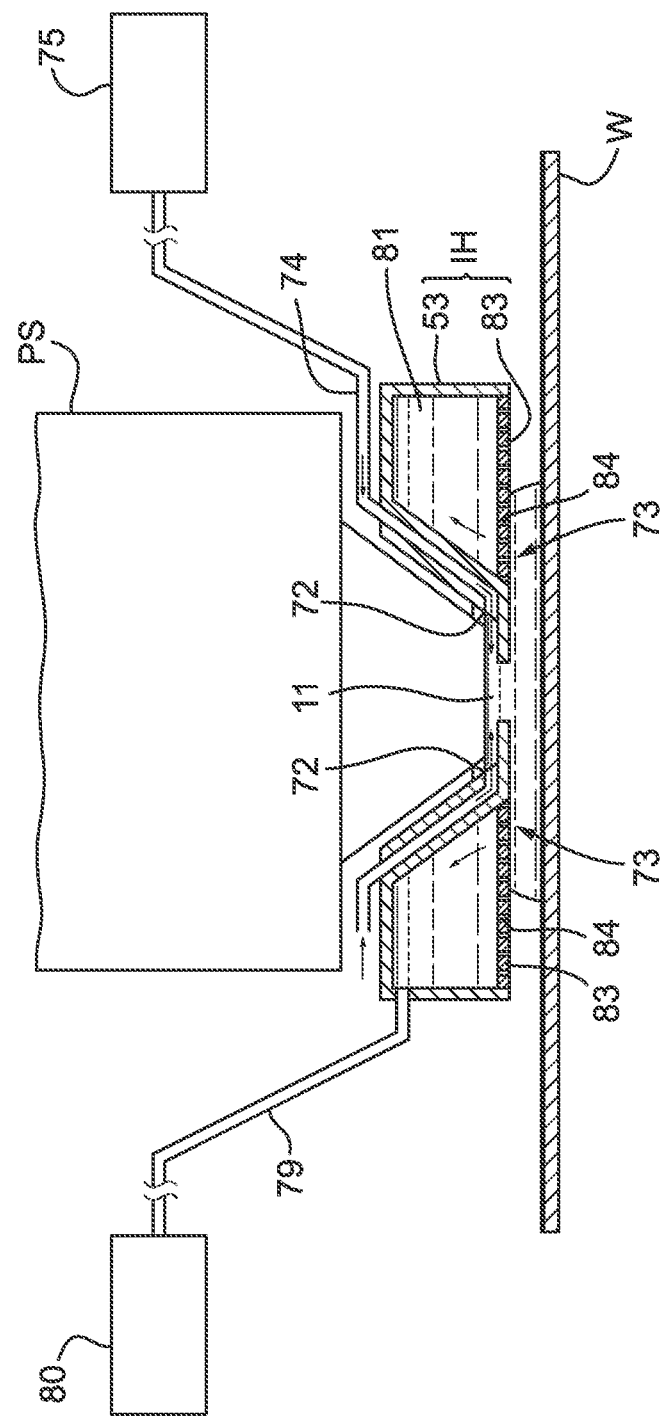
FIG. 3 is a side cross sectional view that depicts a further liquid supply system according to an embodiment of the invention.

FIG. 3 is a side cross sectional view that depicts a further liquid confinement structure IH according to an embodiment. The liquid confinement structure IH illustrated in FIG. 3 and described below may be applied to the lithographic apparatus described above and illustrated in FIG. 1. The liquid confinement structure IH extends along at least a part of a boundary of the space between the final element of the projection system PS and the substrate table WT or the substrate W. (Please note that reference in the following text to surface of the substrate W also refers in addition or in the alternative to a surface of the substrate table WT, unless expressly stated otherwise.)

The liquid confinement structure IH at least partly contains liquid in the immersion space 11 between a final element of the projection system PS and the substrate W. The immersion space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949, which is hereby incorporated by reference in its entirety.

The main body member 53 comprises supply ports 72, which are capable of supplying the liquid to the immersion space 11, and a recovery port 73, which is capable of recovering the liquid from the immersion space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the immersion space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid recovered via the recovery port 73 through the passageway 79. The porous member 83 is disposed in the recovery port 73.

In an embodiment, to form the immersion space 11 with the immersion liquid between the projection system PS and the liquid confinement structure IH on one side and the substrate W on the other side, immersion liquid is supplied from the supply ports 72 to the immersion space 11 and the pressure in a recovery chamber 81 in the liquid confinement structure IH is adjusted to a negative pressure so as to recover the immersion liquid via the holes 84 (i.e., the recovery port 73) of the porous member 83. Performing the liquid supply operation using the supply ports 72 and the liquid recovery operation using the porous member 83 forms the immersion space 11 between the projection system PS and the liquid confinement structure IH on one side and the substrate W on the other side.

Figure 4:
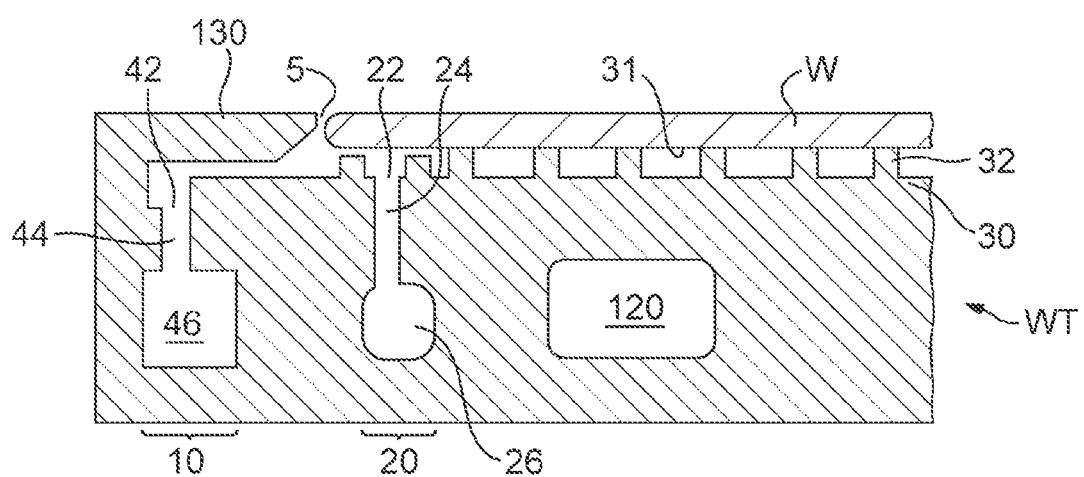
FIG. 4 depicts, in cross-section, a part of a substrate table of an embodiment of the invention.

FIG. 4 illustrates part of a lithographic apparatus according to an embodiment of the present invention. The arrangement illustrated in FIG. 4 and described below may be applied to the lithographic apparatus described above and illustrated in FIG. 1. FIG. 4 is a cross-section through a substrate table WT and a substrate W. A gap 5 exists between an edge of the substrate W and an edge of the substrate table WT. When the edge of the substrate W is being imaged or at other times such as when the substrate W first moves under the projection system PS (as described above), the immersion space 11 filled with liquid by the liquid confinement structure IH (for example) will pass at least partly over the gap 5 between the edge of the substrate W and the edge of the substrate table WT. This can result in liquid from the immersion space 11 entering the gap 5.

The substrate W is held by a support body 30 (e.g. a pimple or burl table) comprising one or more projections 32 (i.e., burls). The support body 30 is an example of an object holder. Another example of an object holder is a mask holder. An under-pressure applied between the substrate W and the substrate table WT helps ensure that the substrate W is held firmly in place. However, if immersion liquid gets between the substrate W and the support body 30 this can lead to difficulties, particularly when unloading the substrate W.

In order to deal with the immersion liquid entering that gap 5 at least one drain 10, 20 is provided at the edge of the substrate W to remove immersion liquid which enters the gap 5. In the embodiment of FIG. 4 two drains 10, 20 are illustrated though there may only be one drain or there could be more than two drains. In an embodiment, each of the drains 10, 20 is annular so that the whole periphery of the substrate W is surrounded.

A primary function of the first drain 10 (which is radially outward of the edge of the substrate W/support body 30) is to help prevent bubbles of gas from entering the immersion space 11 where the liquid of the liquid confinement structure IH is present. Such bubbles may deleteriously affect the imaging of the substrate W. The first drain 10 is present to help avoid gas in the gap 5 escaping into the immersion space 11 in the liquid confinement structure IH. If gas does escape into the immersion space 11, this can lead to a bubble which floats within the immersion space 11. Such a bubble, if in the path of the projection beam, may lead to an imaging error. The first drain 10 is configured to remove gas from the gap 5 between the edge of the substrate W and the edge of the recess in the substrate table WT in which the substrate W is placed. The edge of the recess in the substrate table WT may be defined by a cover ring 130 which is optionally separate from the support body 30 of the substrate table WT. The cover ring 130 may be shaped, in plan, as a ring and surrounds the outer edge of the substrate W. The first drain 10 extracts mostly gas and only a small amount of immersion liquid.

The second drain 20 (which is radially inward of the edge of the substrate W/support body 30) is provided to help prevent liquid which finds its way from the gap 5 to underneath the substrate W from preventing efficient release of the substrate W from the substrate table WT after imaging. The provision of the second drain 20 reduces or eliminates any problems which may occur due to liquid finding its way underneath the substrate W.

As depicted in FIG. 4, in an embodiment the lithographic apparatus comprises a channel 46 for the passage therethrough of a two phase flow. The channel 46 is formed within a block. The first and second drains 10, 20 are each provided with an opening 42, 22 and a channel 46, 26. The channel 46, 26 is in fluid communication with the respective opening 42, 22 through a passageway 44, 24.

As depicted in FIG. 4, the cover ring 130 has an upper surface 60. The upper surface 60 extends circumferentially around the substrate W on the support body 30. In use of the lithographic apparatus, the liquid confinement structure IH moves relative to the substrate table WT. During this relative movement, the liquid confinement structure IH moves across the gap 5 between the cover ring 130 and the substrate W. In an embodiment the relative movement is caused by the substrate table WT moving under the liquid confinement structure IH. In an alternative embodiment the relative movement is caused by the liquid confinement structure IH moving over the substrate WT. In a further alternative embodiment the relative movement is provided by movement of both the substrate table WT under the liquid confinement structure IH and movement of the liquid confinement structure IH over the substrate WT. In the following description, movements of the liquid confinement structure IH will be used to mean the relative movement of the liquid confinement structure IH relative to the substrate table WT.

In use of the lithographic apparatus, the liquid confinement structure IH moves from a position above the cover ring 130, across the gap 5 and across the substrate W. When the liquid confinement structure IH moves, the immersion space 11 in which the immersion liquid is confined moves together with the liquid confinement structure IH. When the trailing edge of the immersion space 11 moves across the gap 5 and then across the substrate W, it is possible that droplets 12 of the immersion liquid are undesirably deposited on the surface of the substrate W. This can happen for other objects (e.g. sensors) other than a substrate W, although the description will focus on the issue for a substrate W for convenience.

Figure 5:
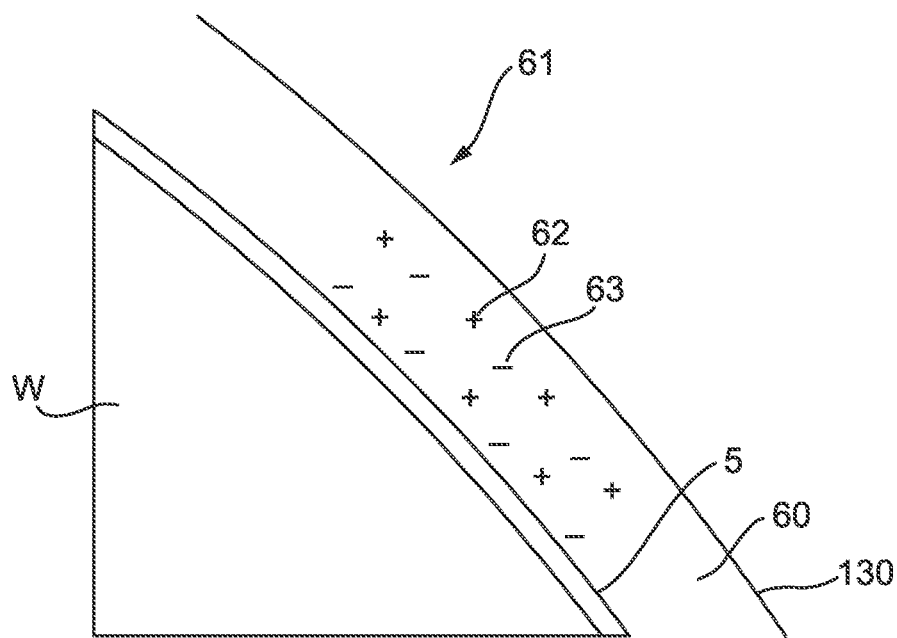
FIGS. 5 and 6 depict, in plan, a part of a substrate table of an embodiment of the invention.

FIG. 5 depicts, in plan, a part of a substrate table WT according to an embodiment of the invention. The substrate table WT is configured to support a substrate W. The substrate W is supported for exposure in the immersion lithographic apparatus.

As shown more clearly in FIG. 4, in an embodiment the substrate table WT comprises a support body 30. The support body 30 has a support surface 31 configured to support the substrate W. In the embodiment depicted in FIG. 4, the support surface 31 corresponds to the plane comprising the top surfaces of each of the projections 32.

As depicted in FIG. 4 and FIG. 5, in an embodiment the substrate table WT comprises a cover ring 130. In an embodiment the cover ring 130 is fixed relative to the support body 30 in use of the lithographic apparatus. As shown in FIG. 4, in an embodiment the cover ring 130 is formed integrally with the support body 30. However, this is not necessarily the case. In an alternative embodiment, the cover ring 130 can be formed as part of a component that is substantially isolated from the support body 30. However, even when the cover ring 130 is, for example, thermally isolated from the support body 30, the cover ring 130 is fixed relative to the support body 30 in use of the lithographic apparatus. In contrast, a mechanical seal that moves relative to the support body 30 during use of the lithographic apparatus is not fixed relative to the support body 30. In an embodiment the cover ring 130 is manufactured as a separate component from the rest of the substrate table WT and subsequently glued on top of the substrate table WT. An example of a substrate table WT comprising an isolated cover ring 130 that can be used in the context of the an embodiment of the invention is disclosed in PCT patent application publication no. WO 2013-178484, hereby incorporated by reference.

The cover ring 130 is configured to surround, in plan view, the substrate W supported on the support surface 31. The upper surface 60 of the cover ring 130 is shown in FIG. 4 and in FIG. 5. When the cover ring 130 is a component that is substantially isolated from the support body 30, the cover ring 130 can be manufactured and sold separately from the rest of the substrate table WT. In the description below, an embodiment of the invention is described in the context of the substrate table WT as a whole. However, an embodiment of the invention can be applied to the cover ring 130 in the absence of the rest of the substrate table WT (e.g. the support body 30).

As described above, in use of the lithographic apparatus, immersion liquid confined in an immersion space 11 moves along the upper surface 60 of the cover ring 130 towards the substrate W. At other times in operation, the immersion space 11 moves away from the substrate W. However, the issue of droplets 12 of immersion liquid being deposited on the substrate W is more relevant when the immersion space 11 moves across the gap 5 towards the substrate W (and then across the substrate W).

The immersion space 11 is a volume of immersion liquid. The top of the immersion space 11 is defined by the bottom of the liquid confinement structure IH. The bottom of the immersion space 11 is defined by whichever surface the immersion space 11 is on (i.e. the opposing surface), for example a substrate W or the upper surface 60 of the cover ring 130. The side surface of the immersion space 11 is defined by a meniscus 17. The meniscus 17 is the surface of the immersion space 11 extending between the liquid confinement structure IH and the opposing surface. The shape and curvature of the meniscus 17 is affected by surface tension. The shape of the meniscus 17 changes depending on the direction and speed of relative movement between the substrate table WT and/or the substrate W and the liquid confinement structure IH. The meniscus 17 of the immersion liquid contacts the opposing surface (e.g. the upper surface 60 of the cover ring 130) at a contact line 18 (shown in FIGS. 7 to 11, for example).

Figure 15:
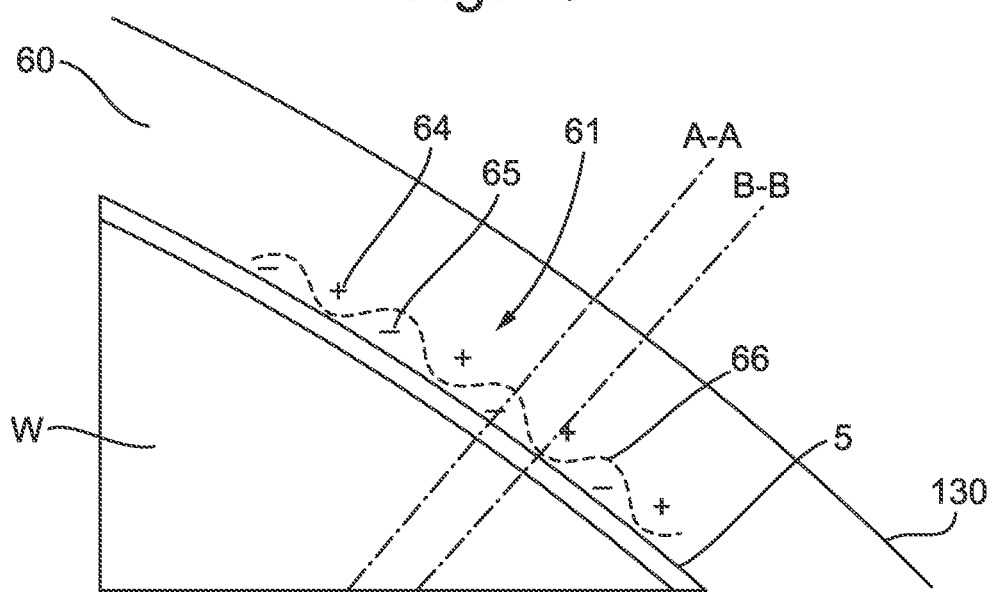
FIG. 15 depicts, in plan, a part of a substrate table of an embodiment of the invention.
Figure 24:
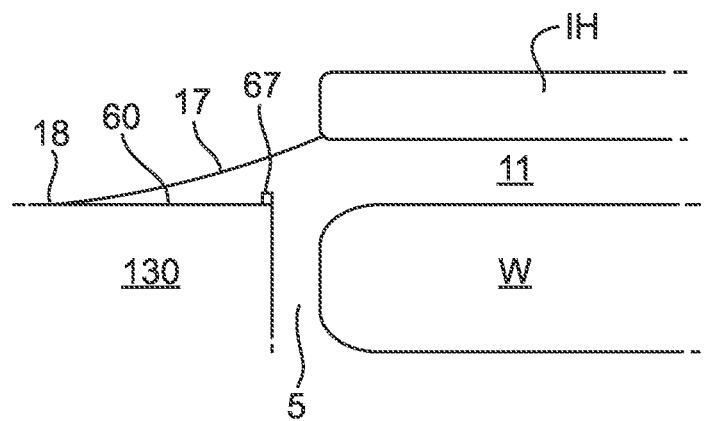
FIGS. 24 to 26 depict, in cross-section, a part of a substrate table of an embodiment of the invention.
Figure 25:
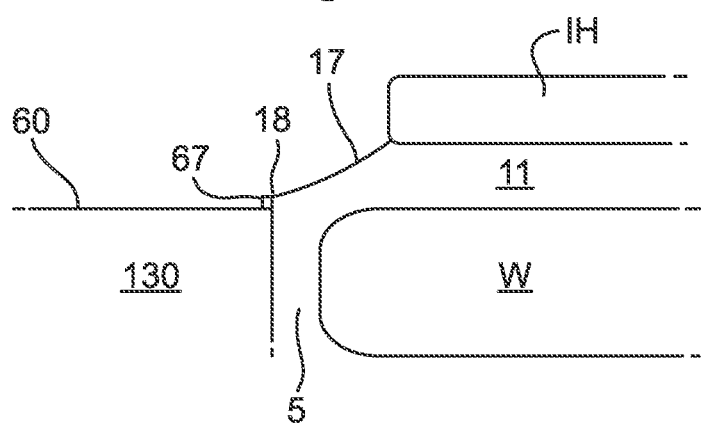
Figure 26:
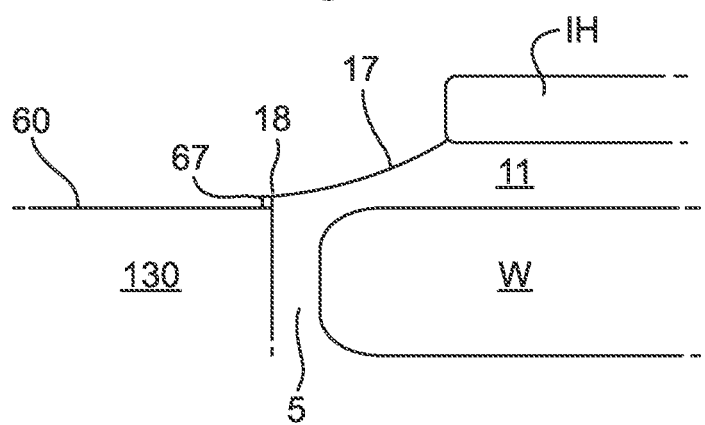

In an embodiment at least a portion 61 of the upper surface 60 of the cover ring 130 is configured so as to alter the stability of the meniscus 17 of immersion liquid when moving along the upper surface 60 towards the substrate W. In an embodiment, the portion 61 of the upper surface 60 of the cover ring 130 is configured so as to destabilize the meniscus 17, as described in more detail below. However, in an alternative embodiment, the portion 61 of the upper surface 60 of the cover ring 130 is configured so as to stabilize the meniscus 17. As will be described in more detail below, stabilization of the meniscus 17 can be achieved by providing a smooth alternating topography along the upper surface 60 (e.g. as shown in FIG. 15), or by facilitating pinning of a contact line 18 between the meniscus 17 and the upper surface 60 of the cover ring 130 (e.g. as shown in FIGS. 24 to 26).

Destabilization of the meniscus 17 results in an unstable contact line 18 between the meniscus 17 and the upper surface 60. The meniscus 17 is destabilized towards a smaller scale. This means that the meniscus 17, which is a fluid film, breaks up into smaller scale fluid films. This breakup occurs when the meniscus 17 of immersion liquid moves along the upper surface 60 towards the substrate W. The relevant part of the meniscus 17 is at the trailing edge of the immersion space 11 during movement of the substrate table WT relative to the liquid confinement structure IH. An embodiment of the invention is expected to achieve a reduction in the possibility of droplets 12 of immersion liquid being deposited on the substrate W. The overall amount of loss of immersion liquid can be reduced. However, it is not necessary for the whole upper surface 60 to be configured so as to destabilize the meniscus 17. As explained in more detail below, in an alternative embodiment a portion of the upper surface 60 is configured so as to stabilize the meniscus 17. In general at least a portion of the upper surface 60 is configured to alter the stability of the meniscus 17, in particular in a controlled manner.

In FIG. 5, the portion 61 of the upper surface 60 that is configured so as to destabilize the meniscus 17 corresponds to the portion 61 containing the plus ("+") signs and minus ("−") signs. The plus signs and minus signs indicate areas on the upper surface 60 having different contact angles with respect to the immersion liquid. A plus sign adjacent to a minus sign means that the area of the upper surface 60 corresponding to the plus sign has a greater contact angle (with respect to the immersion liquid) compared to the area corresponding to the minus sign. In corresponding fashion, an area corresponding to a minus sign has a smaller contact angle (with respect to the immersion liquid) compared to the contact angle for the adjacent area with a plus sign.

As shown in FIG. 5, in an embodiment the upper surface 60 is configured such that its contact angle with respect to the immersion liquid varies along the upper surface 60 so as to destabilize the meniscus 17. The variation in contact angle is a means to destabilize the meniscus 17 towards a smaller scale. The breakup of the meniscus 17 is caused by the interfaces between a high contact angle area 62 and a low contact angle area 63. This is shown schematically in FIG. 6.

Figure 6:
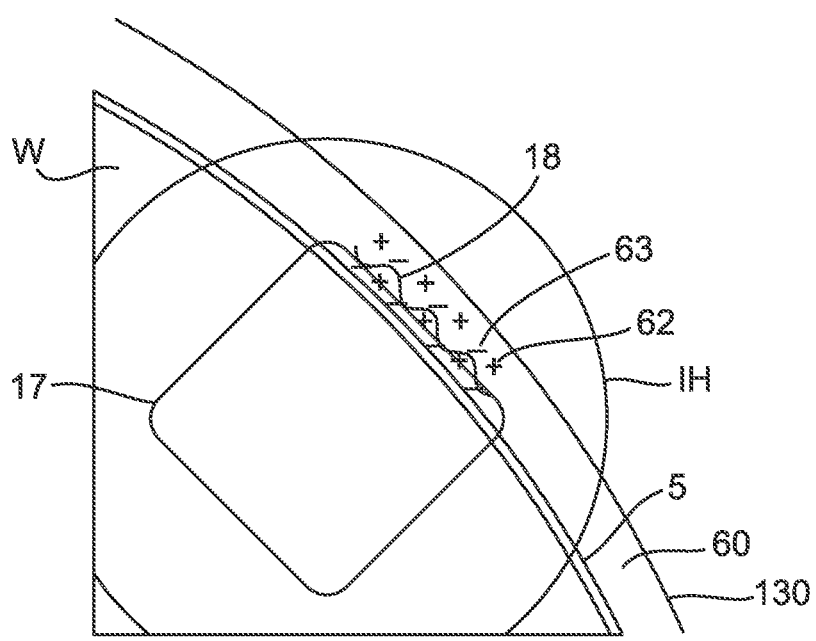

As shown in FIG. 6, the contact line 18 between the meniscus 17 and the upper surface 60 of the cover ring 130 is perturbed. The contact line 18 has a curved or undulating form, in plan view. The length scale of undulations along the contact line 18 depends on the length scale between interfaces between the high contact angle areas 62 and the low contact angle areas 63.

In an embodiment the upper surface 60 is configured such that its contact angle alternates between a high value and a low value. However, this is not necessarily the case. In an embodiment the contact angle of the upper surface 60 successively increases (or alternatively decreases), with discontinuous step changes in the value of the contact angle. The breakup of the meniscus 17 is caused by the interfaces between areas having different (but not necessarily alternating) contact angles, such that the breakup can be caused by successively increasing (or alternatively decreasing) contact angles provided that there are discontinuous step changes at the interfaces.

As depicted in FIG. 5 and FIG. 6, in an embodiment a high contact angle area 62 is adjacent to a low contact angle area 63 in the radial direction of the cover ring 130. The radial direction of the cover ring 130 corresponds to the radial direction of the substrate W. The circumferential direction of the cover ring 130 is perpendicular to the radial direction of the cover ring 130.

FIG. 6 shows an embodiment in which one high contact angle area 62 is adjacent to one low contact angle area 63 in the radial direction of the cover ring 130. However, the number of high contact angle areas 62 and low contact angle areas 63 in the radial direction of the cover ring 130 is not particularly limited. In the embodiment shown in FIG. 6, the portion 61 of the upper surface 60 shown has seven high/low contact angle areas 62, 63 in the circumferential direction of the cover ring 130. However, the total number of high/low contact angle areas 62, 63 in the circumferential direction of the cover ring 130 is not particularly limited.

In an embodiment a spacing between high contact angle areas 62 on the upper surface is at least 50 µm, optionally at least 100 µm. In an embodiment a spacing between high contact angle areas 62 on the upper surface 60 is at most 5000 µm, optionally at most 2000 µm, optionally at most 1000 µm, optionally at most 500 µm, optionally at most 200 µm. In an embodiment a spacing between low contact angle areas on the upper surface 60 is at least 50 µm, optionally at least 100 µm. In an embodiment a spacing between low contact angle areas on the upper surface 60 is at most 500 µm, optionally at most 200 µm.

In an embodiment the contact angle is varied by varying a roughness of the upper surface 60. In an embodiment the cover ring 130 has alternating microscale roughness to promote the breakup of the fluid film to a smaller scale. By varying the surface roughness, patches with high and low dynamic contact angle occur. The contact angle of the immersion liquid on the upper surface 60 is strongly affected by deviations of the upper surface 60 away from ideal smoothness. For example, a change in topography of about 2 µm can change the dynamic contact angle by about 20°.

In an embodiment, in use of the lithographic apparatus the height of the liquid confinement structure IH above the upper surface 60 of the cover ring 130 may be in the region of about 100 µm. The microscale topography of the upper surface 60 can be controlled so as to control the dynamic contact angle of the upper surface 60 with respect to the immersion liquid. In general, an increase in roughness of the upper surface 60 leads to an increase in contact angle of the upper surface 60 with respect to the immersion liquid.

In an embodiment the high contact angle areas 62 are formed by machining microstructures on the upper surface 60 of the cover ring 130. The method for machining the microstructures on the upper surface 60 of the cover ring 130 is not particularly limited. As an example, the upper surface 60 can be machined by femtosecond pulsed laser ablation. The type of microstructures machined into the upper surface 60 is not particularly limited. As an example, in an embodiment the microstructures comprise spaced pillars, which may optionally be covered by a ripple pattern. A ripple pattern comprises periodic ripple structures. A ripple is an undulation in topography of a surface. In an embodiment the spacing between the pillars is in the region of from about 10 µm to about 20 µm.

In an embodiment the low contact angle areas 63 correspond to areas of the upper surface 60 that have not had microstructures machined. In an alternative embodiment, the low contact angle area 63 may correspond to areas that have been treated in some way in order to reduce the contact angle with respect to the immersion liquid.

When the contact line 18 of the meniscus 17 moves from a low contact angle area 63 to a high contact angle area 62, the behaviour of the contact line 18 is similar to when a contact line moves from a hydrophilic surface to a hydrophobic surface. The interface between the high contact angle area 62 and the low contact angle area 63 acts as a local pinning feature, which results in an unstable contact line 18.

When the contact line 18 moves in the opposite direction, from a high contact angle area 62 to a low contact angle area 63, the behaviour is similar to when a contact line moves from a hydrophobic surface to a hydrophilic surface. The interface between the high contact angle area 62 and the low contact area 63 does not act as a local pinning feature and does not result in an unstable contact line.

FIGS. 7 to 12 depict the movement of the liquid confinement structure IH across the upper surface 60 of the cover ring 130, across the gap 5 and onto the substrate W. FIGS. 7 to 12 represent a chronological sequence. As shown in FIG. 7, the contact line 18 of the meniscus 17 is on the upper surface 60 of the cover ring 130. The liquid confinement structure IH is in motion from right to left in FIG. 7, i.e. from the upper surface 60 of the cover ring 130 towards the substrate W.

As shown in FIG. 7, the meniscus 17 (which is at the trailing edge of the immersion space 11) is angled from the liquid confinement stretcher IH generally downwards and away from the substrate W. This is in part because of the motion of the substrate table WT relative to the liquid confinement structure IH.

In FIG. 8, the liquid confinement structure IH has moved to the left compared to the situation shown in FIG. 7. In the moment depicted in FIG. 8, the contact line 18 has moved across the upper surface 60 of the cover ring 130 and has reached the edge of the upper surface 60 that is adjacent to the gap 5 and nearest to the substrate W. This edge of the upper surface 60 pins the contact line 18 of the meniscus 17. As shown in FIG. 9, when the liquid confinement structure IH continues to move away from the cover ring 130, the contact line 18 remains at the edge of the upper surface 60.

As shown in FIG. 10, when the liquid confinement structure IH continues to advance away from the cover ring 130, the meniscus 17 stretches. FIG. 11 depicts the situation in which the meniscus 17 has stretched so far that the meniscus 17 breaks at a breaking point 19. At this point in time, the contact line 18 of the meniscus 17 remains pinned at the edge of the upper surface 60 facing the substrate W. FIG. 12 depicts the effect of the meniscus 17 breaking at the breaking point 19. In particular, when the meniscus 17 breaks, droplets 12 of the immersion liquid are deposited on the substrate W. There is a loss of immersion liquid from the immersion space 11. In contrast, according to an embodiment of the invention, the meniscus 17 is destabilized such that it does not stretch as far before breaking. An embodiment of the invention is expected to achieve a reduction in loss of the immersion liquid.

Figure 13:
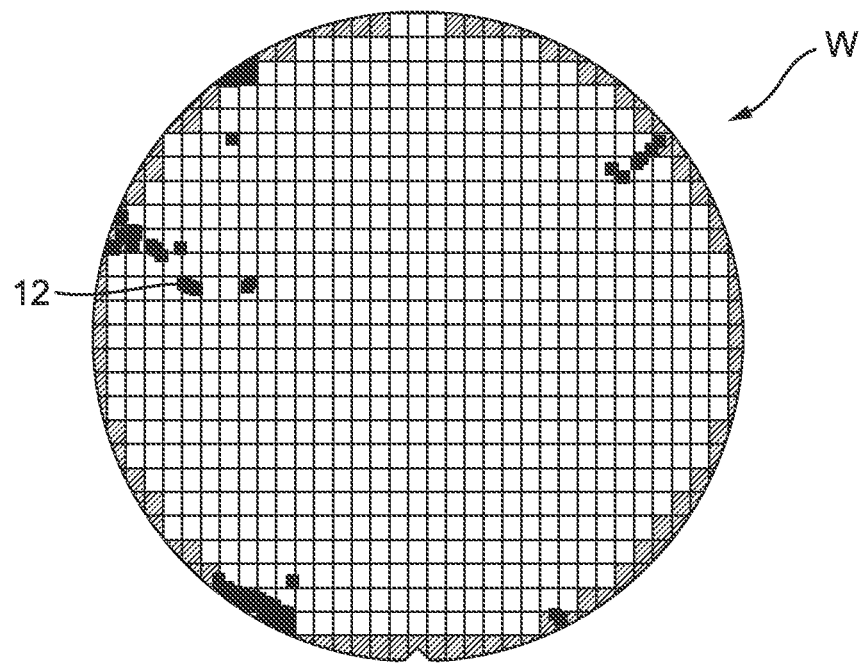
FIG. 13 depicts, in plan, a substrate showing droplets being deposited on the substrate.

FIG. 13 depicts, in plan, a substrate W in which droplets 12 of immersion liquid have been deposited. FIG. 13 shows a typical distribution of droplets 12 after an exposure operation in which the liquid confinement structure IH has meandered across the substrate W, crossing the gap 5 several times. As shown in FIG. 13, the highest concentration of droplets 12 is at the diagonals of the substrate W. The reason for this is explained with reference to FIG. 14 below.

Figure 14:
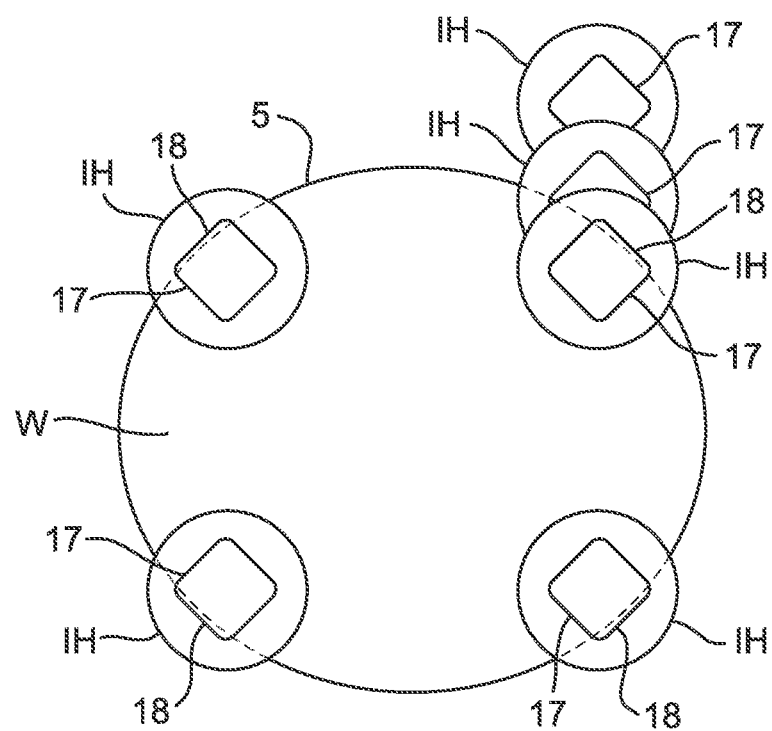
FIG. 14 depicts, in plan, the positions of a liquid confinement structure relative to a substrate at various points in time.

FIG. 14 depicts, in plan, various positions of the liquid confinement structure IH at different points in time relative to the substrate W and the gap 5. In particular, FIG. 14 is a schematic representation of moments when the liquid confinement structure IH crosses the gap 5 around the edge of the substrate W. FIG. 14 shows the crossings of the liquid confinement structure IH that result in the meniscus 17 at the trailing edge of the immersion space 11 being substantially parallel to the gap 5 at a point in time during the crossing. The meniscus 17 may not be exactly parallel to the gap 5, in particular because the gap 5 itself is substantially circumferential around the substrate W. However, as shown in FIG. 14 the meniscus 17 is substantially parallel to the gap 5. Accordingly, these crossing are sometimes called parallel crossings between the liquid confinement structure IH and the gap 5.

In an embodiment the parallel crossings between the liquid confinement structure IH and the gap 5 take place at the diagonals of the substrate W, leading to the distribution of droplets 12 of immersion liquid shown in FIG. 13. The mechanism for the droplets 12 of the immersion liquid being deposited on the substrate W is shown in FIGS. 7 to 12.

In an embodiment of the invention, it is not necessary for the contact angle of the upper surface 60 of the cover ring 130 to be varied by varying a roughness of the upper surface 60. Additionally or alternatively, the contact angle of the upper surface 60 is varied by varying applying at least one of at least a lyophobic coating (and/or hydrophobic coating) and a lyophilic coating (and/or hydrophilic coating) to predetermined areas of the upper surface 60.

For example, in an embodiment the high contact angle areas 63 are formed by applying a lyophobic coating to the corresponding area of the upper surface 60. The low contact angle areas 63 can correspond to areas of the upper surface 60 that have not had the lyophobic coating applied. Alternatively, the low contact angle areas 63 can be formed by applying a lyophilic coating to the corresponding area of the upper surface 60. When the low contact angle areas 63 are formed by applying a lyophilic coating to corresponding areas of the upper surface 60, the high contact angle areas 62 can be formed by applying a lyophobic coating or simply by not applying the lyophilic coating.

In an embodiment the use of at least one of a lyophobic coating and a lyophilic coating is combined with varying the roughness of the upper surface 60 so as to configure the upper surface 60 to destabilize the meniscus 17.

When the contact line 18 moves from a lyophilic coating to a lyophobic coating (or no coating) or when the contact line 18 moves from an area with no coating to a lyophobic coating, the interface acts as a local pinning feature. When the contact line 18 moves from a lyophobic coating to a lyophilic coating (or no coating) or when the contact line 18 moves from an area with no coating to a lyophilic coating, the interface acts as a discontinuous jump, resulting in an unstable contact line.

Alternating lyophobic and lyophilic patches gives a means to destabilize the fluid film of the meniscus 17 towards a smaller scale. The eventual breakup of the smaller scale fluid films leads to less overall loss of immersion liquid from the immersion space 11 onto the substrate W.

As depicted in FIG. 5 and FIG. 6, in an embodiment the upper surface 60 is configured such that its contact angle alternatingly increases and decreases along the circumferential direction of the cover ring 130. By alternating the contact angle, the contact line 18 of the meniscus 17 with the upper surface 60 undulates in shape, thereby destabilizing it. In an embodiment the upper surface 60 is configured such that its contact angle alternatingly increases and decreases along the radial direction of the cover ring 130. By varying the contact angle along the radial direction of the cover ring 130, the contact line 18 encounters interfaces between areas of different contact angles as it moves along the upper surface 50. This leads to destabilization of the meniscus 17.

FIG. 5 depicts an embodiment in which the portion 61 of the upper surface 60 comprises a plurality of high contact angle areas 62 and a plurality of low contact angle areas 63. The high contact angle areas 62 have a first contact angle with respect to the immersion liquid. The low contact angle areas have a second contact angle with respect to the immersion liquid. The first contact angle is greater than the second contact angle. In an embodiment, at least one of the first contact angle and the second contact angle is the contact angle of the upper surface 60 when it has not been specially treated to control its contact angle (i.e. when no coating or machining has been applied).

In an embodiment the high contact angle areas 62 alternate with the low contact angle areas 63 along the upper surface 60. In an embodiment the high contact angle areas 62 alternate with the low contact angle areas 63 along the circumferential direction of the cover ring 130. In an embodiment each high contact angle area 62 is adjacent to one of the low contact angle areas 63 along a radial direction of the cover ring 130, as shown in FIG. 5.

FIG. 15 depicts, in plan, a part of a substrate table WT according to an embodiment of the invention. The features shown in FIG. 15 and described below can be combined with the features shown in FIG. 5 and FIG. 6, for example.

Alternatively, the features shown in FIG. 15 may be provided in a separate embodiment from the features shown in FIG. 5 and FIG. 6.

In the embodiment shown in FIG. 15, the portion 61 of the upper surface 60 that is configured to destabilize the meniscus 17 is configured so that its topography varies along the upper surface 60 so as to destabilize the meniscus 17. In FIG. 15, the areas corresponding to a plus sign represent areas of higher topography compared to the areas corresponding to a minus sign. The areas corresponding to a minus sign represent areas having a lower topography compared to the areas having a plus sign. The contour line 66 is a contour of height above the supporting surface 31 of the support body 30. As depicted in FIG. 15, in an embodiment the portion 61 of the upper surface 60 is configured such that its topography repeatedly undulates along the circumferential direction of the cover ring 130.

Figure 16:
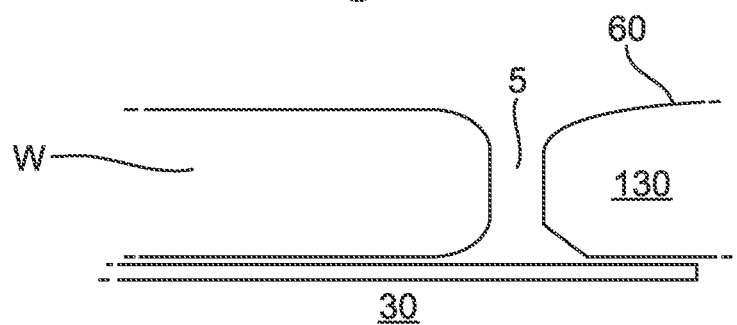
FIGS. 16 and 17 depict, in cross-section, a part of a substrate table of an embodiment of the invention.
Figure 17:
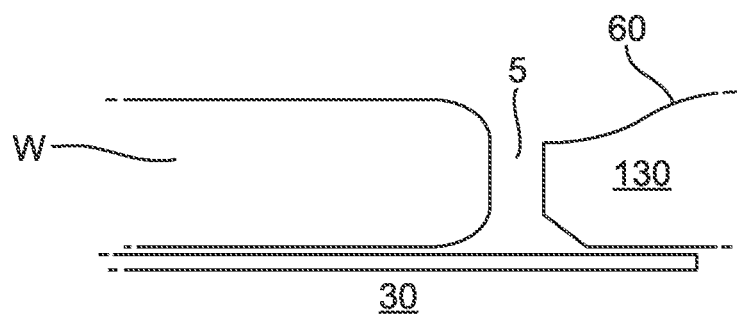

FIGS. 16 and 17 depict, in cross-section, the topography of the cover ring 130. FIG. 16 corresponds to the cross-section taken along line B-B in FIG. 15. FIG. 17 is the cross-sectional view taken along line A-A in FIG. 15. Accordingly, FIG. 16 is the cross-section of a protrusion, while FIG. 17 is the cross-section of a depression.

As depicted in FIG. 15, in an embodiment the portion 61 of the upper surface 60 comprises a plurality of high relief areas 64 and a plurality of low relief areas 65. The high relief areas 64 have a first height above the support surface 31 of the support body 30. The low relief areas 65 have a second height above the support surface 31. The first height is greater than the second height.

As depicted in FIG. 15, in an embodiment the high relief areas 64 alternate with the low relief areas 65 along the upper surface 60 of the cover ring 130. In an embodiment the high relief areas 64 alternate with the low relief areas 65 along the circumferential direction of the cover ring 130, as shown in FIG. 15. Additionally or alternatively, each high relief area 64 is adjacent to one of the low relief areas 65 along a radial direction of the cover ring 130.

The varying topography of the cover ring 130 leads to destabilization of the meniscus 17. The meniscus 17 breaks up into smaller fluid films. The scale of the smaller fluid films depends on the pitch between the high relief areas 64 and the low relief areas 65.

In an embodiment a spacing between high relief areas 64 on the upper surface 60 is at least 50 µm, optionally at least 100 µm. In an embodiment a spacing between high relief areas 64 on the upper surface 60 is at most 5000 µm, optionally at most 2000 µm, optionally at most 1000 µm, optionally at most 500 µm, optionally at most 200 µm. In an embodiment a spacing between low relief areas 65 on the upper surface 60 is at least 50 µm, optionally at least 100 µm. In an embodiment a spacing between low relief areas 65 on the upper surface 60 is at most 500 µm, optionally at most 200 µm.

Figure 18:
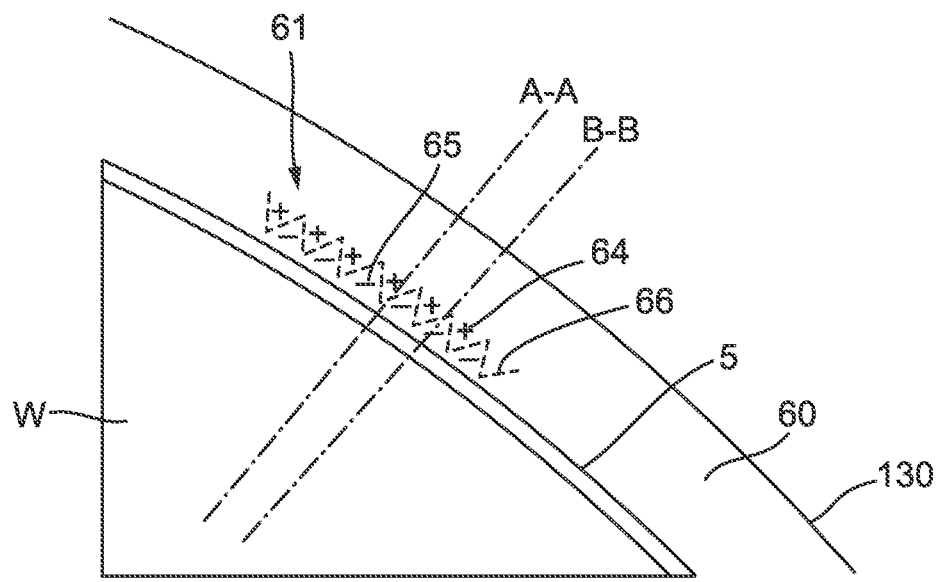
FIG. 18 depicts, in plan, a substrate table of an embodiment of the invention.

FIG. 18 depicts, in plan, a part of a substrate table WT according to an alternative embodiment. As shown in FIG. 18, the shape of the contour line 66 is different compared to that shown in FIG. 15. Whereas in the embodiment shown in FIG. 15 the alternating topography of the cover ring 130 is smooth, in the embodiment shown in FIG. 18 the alternating topography of the cover ring 130 is sharp.

By providing a sharp alternating topography, the sharp edges can act as pinning features configures to pin the contact line 18 of the meniscus 17. The design of sharp alternating topography can be used to control where the meniscus 17 is pinned, where it breaks loose, how it creates a fluid film and leads to eventual loss of immersion liquid. Alternatively, the smooth alternating topography shown in FIG. 15 can reduce pinning of the meniscus 17. This can increase the stability of the meniscus 17, which can lead to less loss of the immersion liquid.

One or more embodiments of the invention have been described above in the context of one portion 61 of the upper surface 60 of the cover ring 130 being configured in a particular way so as to destabilize the meniscus 17. In an embodiment four portions 61 of the upper surface 60 evenly distributed around the cover ring 130 are configured so as to destabilize the meniscus 17. For example, the portions 61 can be evenly distributed so as to correspond to the diagonals at which loss of immersion liquid is most likely to occur (e.g. as shown in FIG. 13). In an embodiment the portions 61 of the upper surface 60 where a circumferential direction of the cover ring 130 is substantially parallel to an edge of the meniscus 17 are configured so as to destabilize the meniscus 17.

In an embodiment portions of the upper surface 60 between the four portions 61 configured to destabilize the meniscus 17 have a substantially constant topography and contact angle with respect to the immersion liquid. In other words, in an embodiment only the four portions 61 of the upper surface 60 are configured to destabilize the meniscus 17, whereas the intermediary portions of the cover ring 130 are not configured in this way. The portions 61 can be discontinuously provided around the cover ring 130. In an alternative embodiment the means for destabilizing the meniscus 17 can be provided continuously around the upper surface 60 of the cover ring 130.

Figure 19:
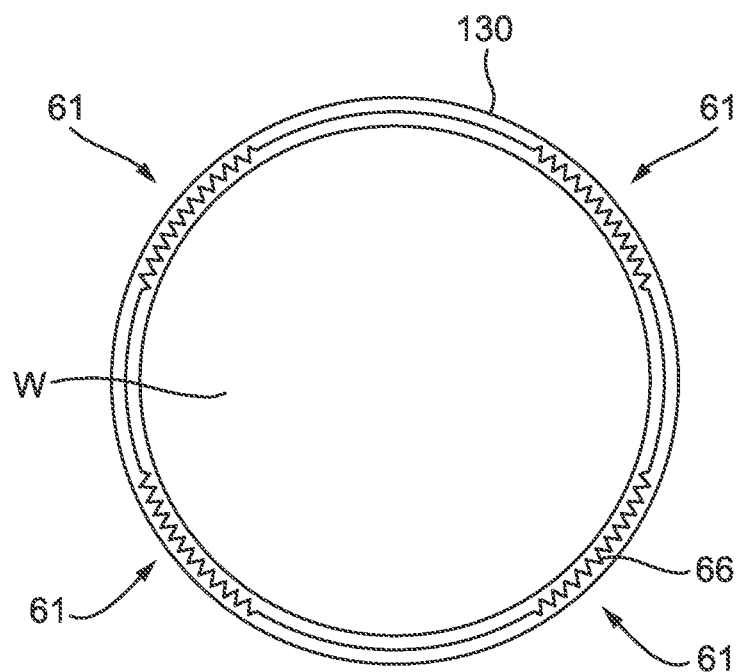
FIG. 19 depicts, in plan, a substrate table of an embodiment of the invention.

FIG. 19 depicts, in plan, part of a substrate table WT according to an embodiment of the invention. In the embodiment shown in FIG. 19, the topography of the upper surface 60 of the cover ring 130 is varied only at four portions 61 corresponding to diagonals of the substrate table WT. This is shown by the contour line 66 which undulates at the diagonals but is otherwise relatively smooth.

It is not necessary for there to be four portions 61 configured to destabilize the meniscus 17. In an embodiment the number of portions 61 of the upper surface configured to destabilize the meniscus 17 is one, two, three, or more than four.

FIGS. 20 to 23 depict, in cross-section, part of a substrate table WT according to an embodiment of the invention. FIGS. 20 to 23 represent a chronological sequence. The features depicted in FIGS. 20 to 23 and described below can be applied to any of the embodiments described above.

Figure 20:
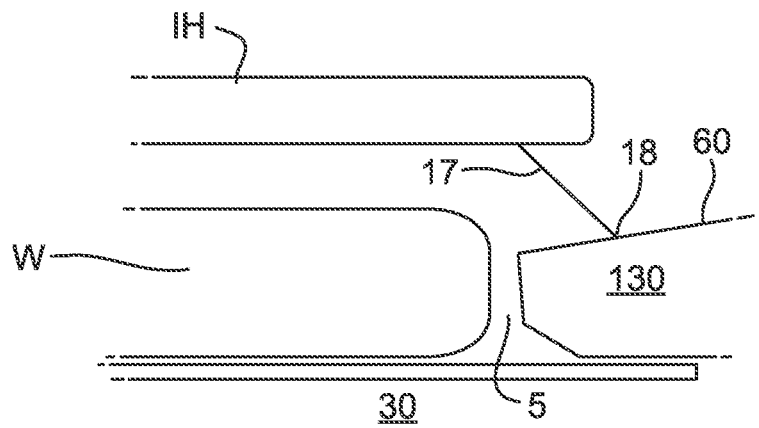
FIGS. 20 to 23 depict, in cross-section, a part of a substrate table of an embodiment of the invention at different points in time.

As shown in FIG. 20, in an embodiment the average height of the portion 61 of the upper surface 60 decreases towards the substrate W. The height of the upper surface 60 is the height above the support surface 31 of the support body 30. By providing that the height of the upper surface 60 decreases towards the substrate W, the portion 61 of the upper surface generally slopes downwards towards the substrate W. This is shown in FIG. 20.

Figure 21:
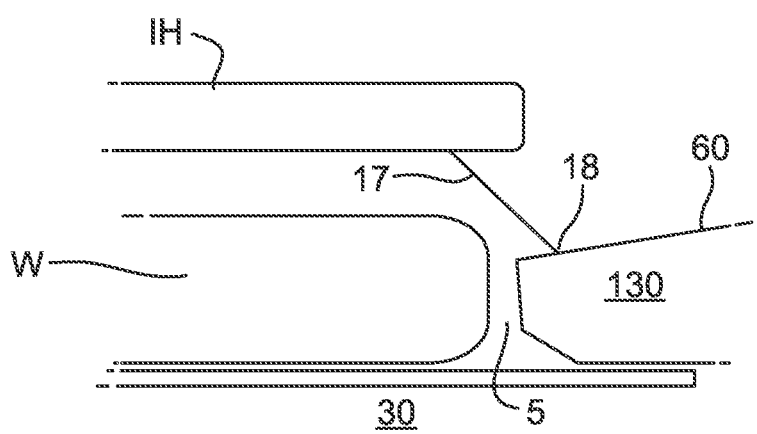

At the moment in time shown in FIG. 20, the contact line 18 of the meniscus 17 is on the upper surface 60 of the cover ring 130. In FIG. 21, the liquid confinement structure IH has advanced towards the substrate W. The contact line 18 of the meniscus 17 remains on the upper surface 60 of the cover ring 130.

Figure 22:
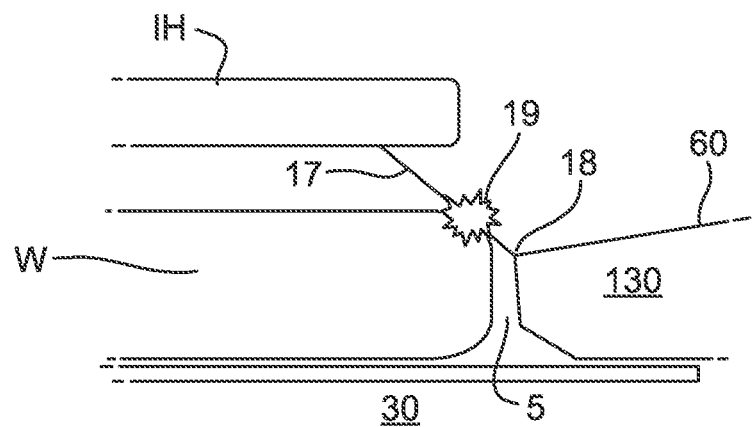
Figure 23:
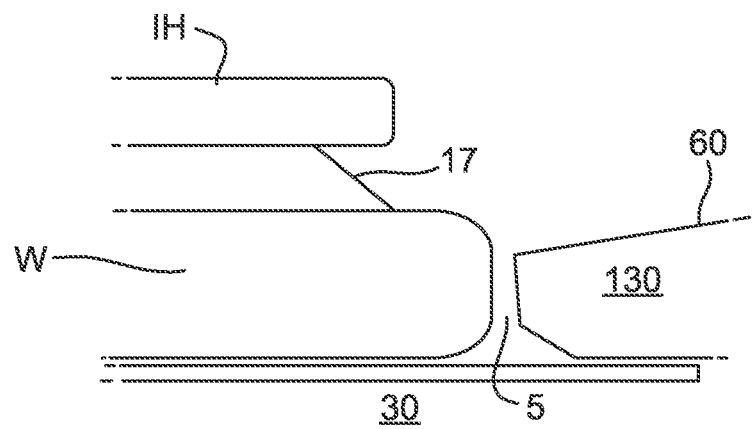

In FIG. 22, the meniscus 17 breaks at a breaking point 19. The breaking point 19 corresponds to a position at which the meniscus 17 comes into contact with the corner of the substrate W. The meniscus 17 comes into contact with the substrate W because the height of the upper surface 60 is lower than the top of the substrate W. The meniscus 17 collides with the edge of the substrate W before, or shortly after, the contact line 18 can be pinned by the edge of the upper surface 60 that is adjacent to the substrate W. Accordingly, no extended fluid film is created and the meniscus 17 can advance along the substrate W without the fluid film being pulled, which can otherwise lead to droplets 12 being formed on the substrate W. This is shown in FIG. 23.

FIG. 24 depicts, in cross-section, part of a substrate table WT according to an alternative embodiment of the invention. As depicted in FIG. 24, in an embodiment at least a portion of the upper service 60 is configured so as to facilitate pinning of the contact line 18 when moving along the upper surface 60 towards the substrate W. The contact line 18 is between the meniscus 17 of immersion liquid and the upper surface 60.

By facilitating pinning of the contact line 18, the meniscus 17 is made more stable. As a result, the volume of immersion liquid contained directly below the meniscus 17 is reduced. Accordingly, the amount of immersion liquid that can be undesirably deposited on the substrate W is reduced. Accordingly, the loss of immersion liquid can be reduced. This is shown in the chronological sequence from FIG. 24 through to FIG. 26.

FIG. 25 shows the point in time in which the contact line 18 is pinned by a barrier 67 (or ledge). The barrier 67 is configured to pin the contact line 18 between the meniscus 17 and the upper surface 60.

FIG. 26 depicts the later moment at which the meniscus 17 has been stretched. At this point in time the meniscus 17 remains stable because of the barrier 67 pinning the contact line 18. As shown schematically in FIG. 26, the curvature of the meniscus 17 is affected by the pinning and the stretching, so that the volume of immersion liquid immediately below the meniscus 17 is reduced.

The barrier 67 is an example of a mechanical feature configured to pin the contact line 18 of the meniscus 17. Other mechanical features could be used, for example a ledge.

In an embodiment the barrier 67 extends along a circumferential direction of the cover ring 130. As depicted in FIGS. 24 to 26, in an embodiment the barrier 67 is provided at the edge of the upper surface 60 closest to the substrate W. The barrier 67 is positioned at a periphery of the upper surface 60 closest to the support surface 31 on which the substrate W is supported.

In an embodiment the barrier 67 is discontinuous. In an embodiment the barrier 67 is provided at four portions of the upper surface 60 evenly distributed around the cover ring 130. As explained above, the possibility of droplets 12 of immersion liquid being deposited on the substrate is greatest at the diagonals of the substrate W where the meniscus 17 can be parallel to the gap 5 between the cover ring 130 and the substrate W. By providing the barrier 67 at four discontinuous portions of the upper surface 60, the barrier 67 can be provided where it is most useful for reducing the deposition of droplets 12 on the substrate W.

However, it is not necessary to provide a barrier 67 or ledge in order to pin the contact line 18. In an embodiment the upper surface 60 is superlyophilic with respect to the immersion liquid so as to pin the contact line 18 between the meniscus 17 and the upper surface 60. Superlyophilic means that the immersion liquid forms substantially no contact angle (almost zero degrees) on the upper surface 60. The superlyophilicity makes it possible to pin the contact line 18 between the meniscus 17 and the upper surface 60.

In an embodiment the upper surface 60 is made superlyophilic by applying a superlyophilic coating. In an alternative embodiment the upper surface 60 is made superlyophilic by machining the upper surface 60 to have columns, for example. The spacing between the columns affects the contact angle of the upper surface 60 with respect to the immersion liquid. By carefully controlling the spacing between the columns, the upper surface 60 can be made to be superlyophilic.

In an embodiment the upper surface 60 is superlyophilic at four portions of the upper surface 60 evenly distributed around the cover ring 130 and less lyophlic between the four portions. In an alternative embodiment the upper surface 60 is superlyophilic continuously around the circumferential direction of the cover ring 130.

In use of the lithographic apparatus, surfaces of the lithographic apparatus can gradually become more lyophilic over time. This is due to the DUV radiation applied to the surfaces. Additionally, exposure of the surfaces to the immersion liquid can make the surfaces more lyophilic. However, the variation of the lyophilicity over time is difficult to control. By providing that the upper surface 60 is superlyophilic, the upper surface 60 will not become less lyophilic during use of the lithographic apparatus. Accordingly, the superlyophilicity can continue to facilitate pinning of the meniscus 17 throughout the lifetime of the lithographic apparatus.

In an embodiment the upper surface 60 of the cover ring 130 is provided with a plurality of pinning features. The barrier 67 is an example of a pinning feature. In an embodiment the plurality of pinning features are circumferentially or radially alternating.

Figure 27:
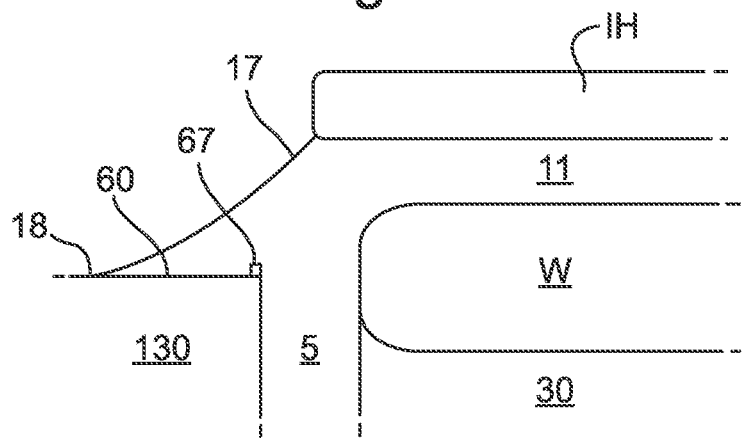
FIGS. 27 to 29 depict, in cross-section, a part of a substrate table of an embodiment of the invention.
Figure 28:
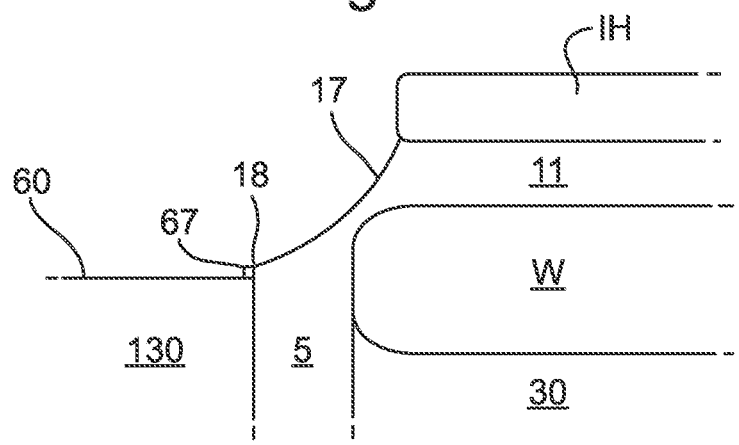
Figure 29:
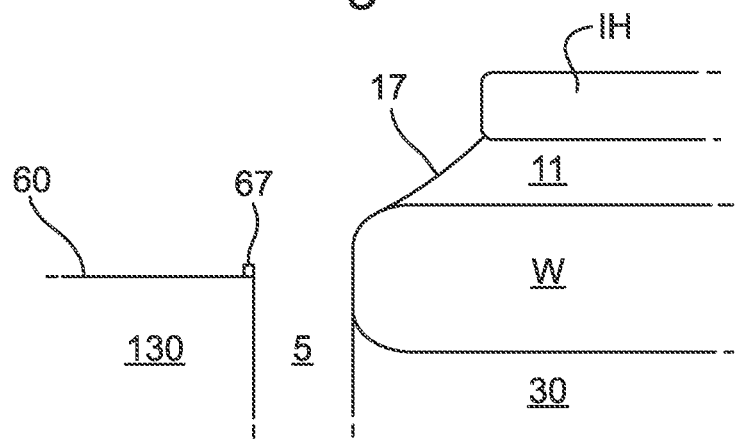

FIGS. 27 to 29 depict an alternative embodiment in which the upper surface 60 is lower than the top of the substrate W. Accordingly, as shown in the chronological sequence from FIGS. 27 to 29, the meniscus 17 can break at an earlier stage, thereby reducing the amount of immersion liquid directly below the meniscus 17. Accordingly, by providing the step change between the upper surface 60 and the top of the substrate W, the loss of immersion liquid on the substrate W can be reduced. The upper surface 60 can be made lower than the top surface of the substrate W by providing a thicker substrate W. Alternatively, the upper surface 60 of the cover ring 130 can be lowered by an actuator (not shown) configured to actuate the upper surface 60 in the Z-direction.

In an embodiment, there is provided a substrate table configured to support a substrate for exposure in an immersion lithographic apparatus, the substrate table comprising: a support body having a support surface configured to support the substrate; and a cover ring fixed relative to the support body and configured to surround, in plan view, the substrate supported on the support surface, wherein the cover ring has an upper surface; wherein at least a portion of the upper surface is configured so as to alter the stability of a meniscus of immersion liquid when moving along the upper surface towards the substrate so as to destabilize the meniscus.

In an embodiment, the upper surface is configured such that its contact angle with respect to the immersion liquid varies along the upper surface so as to destabilize the meniscus, and/or wherein the at least a portion of the upper surface is configured such that its topography varies along the upper surface so as to destabilize the meniscus. In an embodiment, the contact angle is varied by varying a roughness of the upper surface, and/or wherein the contact angle is varied by varying applying at least one of a lyophobic coating and a lyophilic coating to predetermined areas of the upper surface. In an embodiment, the upper surface is configured such that its contact angle alternatingly increases and decreases along a circumferential direction of the cover ring, and/or wherein the at least a portion of the upper surface comprises a plurality of high contact angle areas having a first contact angle with respect to the immersion liquid and a plurality of low contact angle areas having a second contact angle with respect to the immersion liquid, wherein the first contact angle is greater than the second contact angle. In an embodiment, the high contact angle areas alternate with the low contact angle areas along the upper surface. In an embodiment, the high contact angle areas alternate with the low contact angle areas along a circumferential direction of the cover ring, and/or wherein each high contact angle area is adjacent to one of the low contact angle areas along a radial direction of the cover ring. In an embodiment, the at least a portion of the upper surface is configured such that its topography repeatedly undulates along a circumferential direction of the cover ring. In an embodiment, the at least a portion of the upper surface comprises a plurality of high relief areas having a first height above the support surface and a plurality of low relief areas having a second height above the support surface, wherein the first height is greater than the second height. In an embodiment, the high relief areas alternate with the low relief areas along the upper surface. In an embodiment, the high relief areas alternate with the low relief areas along a circumferential direction of the cover ring, and/or wherein each high relief area is adjacent to one of the low relief areas along a radial direction of the cover ring. In an embodiment, an average height of the at least a portion of the upper surface above the support surface decreases towards the substrate such that the at least a portion of the upper surface generally slopes downwards towards the substrate, and/or wherein four portions of the upper surface evenly distributed around the cover ring are configured so as to destabilize the meniscus. In an embodiment, portions of the upper surface between the four portions configured so as to destabilize the meniscus have a substantially constant topography and contact angle with respect to the immersion liquid.

In an embodiment, there is provided a lithographic apparatus comprising a substrate table as described herein. In an embodiment, the lithographic apparatus comprises a fluid handling structure configured to confine the immersion liquid in an immersion space above a substrate supported on the support surface, wherein portions of the upper surface where a circumferential direction of the cover ring is substantially parallel to an edge of the meniscus are configured so as to destabilize the meniscus.

In an embodiment, there is provided a method of operating an immersion lithographic apparatus, comprising: providing immersion liquid on an upper surface of a cover ring fixed relative to a support body of a substrate table; and controlling the immersion liquid to move from the upper surface onto a substrate supported by a support surface of the support body; wherein at least a portion of the upper surface is configured so as to alter the stability of a meniscus of the immersion liquid when moving along the upper surface towards the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A substrate table configured to support a substrate for exposure in an immersion lithographic apparatus, the substrate table comprising:
   a support surface configured to support the substrate; and
   a structure configured to surround, in plan view, the substrate when supported on the support surface,
   wherein at least a portion of an upper surface of the structure has a property configured so as to destabilize a meniscus of immersion liquid when there is relative movement between the meniscus and the upper surface, the property varying in a peripheral direction along the upper surface and varying in a radial direction from a center of the support surface.

2. The substrate table of claim 1, wherein the property comprises contact angle with respect to the immersion liquid and wherein the at least portion of the upper surface is configured such that its contact angle with respect to the immersion liquid varies along the upper surface so as to destabilize the meniscus.

3. The substrate table of claim 2, wherein the contact angle is varied through a varying roughness of the upper surface, and/or wherein the contact angle is varied through a varied application of a lyophobic coating and/or a lyophilic coating to predetermined areas of the upper surface.

4. The substrate table of claim 2, wherein the upper surface is configured such that its contact angle varies along the peripheral direction.

5. The substrate table of claim 2, wherein the upper surface is configured such that its contact angle varies along the radial direction.

6. The substrate table of claim 2, wherein the at least a portion of the upper surface comprises a plurality of high contact angle areas having a first contact angle with respect to the immersion liquid and a plurality of low contact angle areas having a second contact angle with respect to the immersion liquid, wherein the first contact angle is greater than the second contact angle and wherein the high contact angle areas alternate with the low contact angle areas along the upper surface.

7. The substrate table of claim 6, wherein the high contact angle areas alternate with the low contact angle areas along the peripheral direction.

8. The substrate table of claim 6, wherein each high contact angle area is adjacent to one of the low contact angle areas along the radial direction.

9. The substrate table of claim 1, wherein the at least a portion of the upper surface is configured such that its topography varies along the upper surface so as to destabilize the meniscus.

10. The substrate table of claim 1, wherein the at least a portion of the upper surface is configured such that its topography smoothly undulates along the peripheral direction.

11. The substrate table of claim 1, wherein the at least a portion of the upper surface comprises a plurality of high relief areas having a first height above the support surface and a plurality of low relief areas having a second height above the support surface, wherein the first height is greater than the second height.

12. The substrate table of claim 11, wherein each high relief area is adjacent to one of the low relief areas along the radial direction.

13. The substrate table of claim 11, wherein the high relief areas alternate with the low relief areas along the peripheral direction.

14. The substrate table of claim 1, wherein an average height of the at least a portion of the upper surface above the support surface decreases towards the support surface such that the at least a portion of the upper surface generally slopes downwards towards the substrate when supported on the support surface.

15. The substrate table of claim 1, wherein discrete and separate portions of the upper surface around the substrate, when supported on the support surface, are configured so as to destabilize the meniscus.

16. The substrate table of claim 15, wherein parts of the upper surface between the portions configured so as to destabilize the meniscus have a substantially constant topography and contact angle with respect to the immersion liquid.

17. A lithographic apparatus comprising:
   the substrate table of claim 1; and
   a fluid handling structure configured to confine the immersion liquid in an immersion space above the support surface of the substrate table.

18. A substrate table configured to support a substrate for exposure in an immersion lithographic apparatus, the substrate table comprising:
   a support surface configured to support the substrate; and
   a structure configured to surround, in plan view, the substrate when supported on the support surface,
   wherein at least a portion of an upper surface of the structure has an alternatingly varying property configured so as to destabilize a meniscus of immersion liquid when there is relative movement between the meniscus and the upper surface, and wherein the at least a portion of the upper surface is configured such that its contact angle with respect to the immersion liquid varies along the upper surface so as to destabilize the meniscus.

19. The substrate table of claim 18, wherein the property varies in a peripheral direction along the upper surface and/or varies in a radial direction from a center of the support surface.

20. A lithographic apparatus comprising:
   the substrate table of claim 18; and
   a fluid handling structure configured to confine the immersion liquid in an immersion space above the support surface of the substrate table.

* * * * *